(12) United States Patent
Yamazaki

(10) Patent No.: US 8,885,675 B2
(45) Date of Patent: Nov. 11, 2014

(54) WAVELENGTH VARIABLE LASER DEVICE, AND METHOD AND PROGRAM FOR CONTROLLING THE SAME

(75) Inventor: Hiroyuki Yamazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 192 days.

(21) Appl. No.: 12/922,058

(22) PCT Filed: Mar. 6, 2009

(86) PCT No.: PCT/JP2009/054319
§ 371 (c)(1),
(2), (4) Date: Sep. 10, 2010

(87) PCT Pub. No.: WO2009/119284
PCT Pub. Date: Oct. 1, 2009

(65) Prior Publication Data
US 2011/0013654 A1 Jan. 20, 2011

(30) Foreign Application Priority Data

Mar. 26, 2008 (JP) ................................. 2008-081035

(51) Int. Cl.
| | | |
|---|---|---|
| H01S 3/10 | (2006.01) | |
| H01S 5/14 | (2006.01) | |
| H01S 5/0687 | (2006.01) | |
| H01S 5/026 | (2006.01) | |
| H01S 5/0683 | (2006.01) | |
| H01S 5/028 | (2006.01) | |
| H01S 5/022 | (2006.01) | |

(52) U.S. Cl.
CPC .............. *H01S 5/0687* (2013.01); *H01S 5/026* (2013.01); *H01S 5/142* (2013.01); *H01S 5/06837* (2013.01); *H01S 5/028* (2013.01); *H01S 5/02248* (2013.01)

USPC ............ 372/20; 372/29.023; 372/94; 372/32; 372/50.1; 372/50.22

(58) Field of Classification Search
USPC ............... 372/20, 29.023, 94, 32, 50.1, 50.22
See application file for complete search history.

(56) References Cited

U.S. PATENT DOCUMENTS 6,661,815 B1 * 12/2003 Kozlovsky et al. ............. 372/20
2006/0088066 A1 * 4/2006 He ................................. 372/10

(Continued)

FOREIGN PATENT DOCUMENTS

| JP | 6-244488 A | 9/1994 |
|---|---|---|
| JP | 2002502133 A | 1/2002 |

(Continued)

OTHER PUBLICATIONS

International Search Report for PCT/JP2009/054319 rrtailed Apr. 14, 2009.

(Continued)

*Primary Examiner* — Tod T Van Roy
(74) *Attorney, Agent, or Firm* — Sughrue Mion, PLLC

(57) ABSTRACT

Provided is a wavelength variable laser device wherein an SOA is simplified. The wavelength variable laser device includes: an optical filter formed on a PLC; an SOA that supplies light to the optical filter; a light reflecting section that returns the light transmitted through the optical filter to the SOA via the optical filter; optical waveguides which are formed on the PLC and connect the SOA, the optical filter, and the light reflecting section; a wavelength variable section that changes a wavelength of the light transmitting through the optical filter; and a phase variable section that changes a phase of the light propagated on the optical waveguides.

3 Claims, 7 Drawing Sheets

(56) References Cited

U.S. PATENT DOCUMENTS

| | | | | |
|---|---|---|---|---|
| 2006/0222039 | A1* | 10/2006 | Yamazaki | 372/94 |
| 2008/0056311 | A1* | 3/2008 | Takeuchi et al. | 372/20 |
| 2008/0137698 | A1* | 6/2008 | Sorin et al. | 372/23 |
| 2009/0060526 | A1* | 3/2009 | Matsui et al. | 398/185 |

FOREIGN PATENT DOCUMENTS

| | | |
|---|---|---|
| JP | 2005327881 A | 11/2005 |
| JP | 2006245346 A | 9/2006 |
| JP | 3908730 B2 | 1/2007 |
| JP | 2007134414 A | 5/2007 |
| JP | 2008060445 A | 3/2008 |
| WO | 03001635 A | 1/2003 |

OTHER PUBLICATIONS

Japanese Office Action for JP2010-505506 mailed on Feb. 26, 2013.

* cited by examiner ary, with a monolithic-type wavelength variable laser, a
semiconductor layer of a composition wavelength having no
optical gain for the oscillation wavelength is provided as a
phase control region within the optical waveguide, and the
refractive index of the semiconductor layer is changed by
implanting electric currents to the phase control region so as
to control the phase condition at the time of laser resonance.

In the meantime, the wavelength variable laser device 70 is
provided with the SOA 73 having a phase control region 83 to
change the refractive index of the optical waveguide of the
phase control region 83 electrically to achieve a function that
is equivalent to the phase adjustment mechanism of a monolithic type.

FIG. 7 is a schematic sectional view showing the SOA of
the wavelength variable laser device shown in FIG. 6. Hereinafter, explanations will be provided by referring to FIG. 6
and FIG. 7.

The SOA 73 includes: a laminate body formed with a
p-type semiconductor layer 84, active layers 85, 86, and an
n-type semiconductor layer 87; electrodes 88, 89, and 90
provided on a voltage applying surface of the laminate body;
and a low-reflective coating 91 and a non-reflective coating
92 provided on a light-emitting surface of the laminate body.
Further, the SOA 73 is separated into a gain control region 93
and the phase control region 83 in terms of the functions
thereof. The gain control region 93 has an exclusive electrode
88 and an exclusive active layer 85. The phase control region
83 has an exclusive electrode 89 and an exclusive active layer
86. The active layer 86 is of a different composition from that
of the active layer 85, and emits a composition wavelength
having no optical gain for the oscillation wavelength.

In addition to the phase control function of the double ring
resonator 72, the phase control region 83 also has a phase
modulation function for suppressing stimulated Brillouin
scattering (referred to as "SBS" hereinafter) generated in the
optical fiber as the output target. In the phase control region
83, a plasma effect is generated by implanting carriers to the
active layer 86, and changes in the refractive index caused
thereby are utilized to achieve the phase control function and
the phase modulation function.

Patent Document 1: Japanese Unexamined Patent Publication 2006-245346

WAVELENGTH VARIABLE LASER DEVICE, AND METHOD AND PROGRAM FOR CONTROLLING THE SAME

TECHNICAL FIELD

The present invention relates to a wavelength variable laser
device and the like, which are used in optical communications
of WDM (Wavelength Division Multiplexing) transmission
method and the like. Hereinafter, a "planar lightwave circuit"
is abbreviated as a "PLC" and a "semiconductor optical
amplifier" is abbreviated as an "SOA".

BACKGROUND ART

In the optical communications, in order to achieve efficient
utilization of the optical fibers, a WDM transmission system,
which achieves high-speed optical transmission with a single
optical fiber by multiplexing a plurality of optical signals of
different wavelengths, has come to be employed more and
more. Further, the use of a dense WDM (DWDM) which
enables still higher-speed transmission by multiplexing optical signals of several tens of different wavelengths has been
spread.

Further, ROADM (Reconfigurable Optical Add/Drop Multiplexer) which adds/drops optical signals of an arbitrary
wavelength at each node has been studied for practical use.
When this ROADM system is employed, it becomes possible
not only to expand the transmission capacitance by wavelength multiplexing but also to switch the optical paths by
changing the wavelengths. Thus, versatility in optical networks is expanded drastically. In this case, light sources corresponding to each wavelength are required in an optical
communication network system, so that the number of
required light sources is increased drastically in accordance
with high multiplexing.

A wavelength variable laser device shown in FIG. 6 is
known as a light source for the WDM transmission system
(Patent Document 1, for example). Hereinafter, explanations
will be provided by referring to this drawing.

A wavelength variable laser device 70 includes: a double
ring resonator 72 formed on a PLC 71; an SOA 73 which
supplies light to the double ring resonator 72; a high-reflective coating 74 that returns the light transmitted through the
double ring resonator 72 to the SOA 73 via the double ring
resonator 72; and optical waveguides 75 and 76 which are
formed on the PLC 71 and connect the SOA 73, the double
ring resonator 72, and the high-reflective mirror 74. A double
ring resonator 82 is formed with: ring resonators 77 and 78
having different optical path lengths from each other; and an
optical waveguide 79 which connects the ring resonators 77
and 78. Film-like heaters 80a, 80b, 81a, and 81b for changing
the wavelength of the light transmitting through the ring
resonators 77 and 78 are provided on the ring resonators 77
and 78.

As described above, the wavelength variable laser device
70 is in a structure in which the double ring resonator 72 is
structured on the PLC 71, and the SOA 73 is directly mounted
onto the PLC 71. The circumferences of the two ring resonators 77 and 78 formed on the PLC 71 are slightly different
from each other. The Vernier effect occurs due to the difference in the circumferences, so that it is possible to obtain
output light 82 with a wide variable range of wavelengths.

It is necessary with typical wavelength variable lasers to
stabilize oscillation by optimizing the phase condition of
laser resonators in regards to the oscillated wavelengths, so
that a phase adjustment mechanism is employed. For

DISCLOSURE OF THE INVENTION

Problems to be Solved by the Invention

However, there are following issues in the wavelength variable laser device shown in FIG. 6 and FIG. 7.

The SOA 73 is in a complicated structure, such as having
two active layers 85 and 86 of different compositions. Thus,
the manufacturing method thereof is complicated, which
results in facing a high manufacturing cost. As an example of
the manufacturing method, used is a method with which a
laminate body including only the active layer 85 is crystalline-grown, a part of the laminate body is removed by etching,
and a laminate body including the active layer 86 is crystalline-grown in the removed part. As in this case, not only the
manufacturing method is complicated, but also precise butt
joint of the active layer 85 and the active layer 86 is difficult.
Therefore, the yield thereof is poor.

Further, while a technique for utilizing the plasma effect
generated due to implantation of carriers to the active layer 86
is capable of acquiring relatively a fast response, it faces such
an issue that an absorption loss change is generated in accordance with a change in the carrier density, which causes a fluctuation in the light output and deteriorates the light source quantity.

An object of the present invention is to provide a wavelength variable laser device and the like capable of simplifying the SOA.

Means for Solving the Problem

The wavelength variable laser device according to the present invention is characterized to include: an optical filter formed in a planar lightwave circuit; a semiconductor optical amplifier that supplies light to the optical filter; a light reflecting section that returns the light transmitted through the optical filter to the semiconductor optical amplifier via the optical filter; optical waveguides which are formed in the planar lightwave circuit and connect the semiconductor optical amplifier, the optical filter, and the light reflecting section; a wavelength variable section that changes a wavelength of the light transmitting through the optical filter; and a phase variable section that changes a phase of the light propagated on the optical waveguides.

Effects of the Invention

The present invention is structured to perform the phase control of the light transmitting through the optical filter not by the SOA but by the phase variable section, so that the SOA can be simplified. As a result, the manufacturing method of the SOA can be simplified, so that it is possible to decrease the cost of the SOA and to increase the yield.

BEST MODES FOR CARRYING OUT THE INVENTION

Hereinafter, exemplary embodiments of the invention will be described by referring to the drawings.

FIG. 1 is a plan view showing a first exemplary embodiment of a wavelength variable laser device according to the present invention. FIG. 2 is a schematic sectional view showing an SOA of the first exemplary embodiment. Hereinafter, explanations will be provided by referring to those drawings.

As shown in FIG. 1, a wavelength variable laser device 10 of the exemplary embodiment is characterized to include: an optical filter 12 formed on a PLC 11; an SOA 13 which supplies light to the optical filter 12; a light reflecting section 14 which returns the light transmitted through the optical filter 12 to the SOA 13 via the optical filter 12; optical waveguides 15 and 16 which are formed on the PLC 11 and connect the SOA 13, the optical filter 12, and the light reflecting section 14; wavelength variable sections 17, 18, and 19 which change the wavelength of the light transmitting through the optical filter 12; and a phase variable section 20 which changes the phase of the light propagated on an optical waveguide 16.

The wavelength variable laser device 10 according to the exemplary embodiment shown in FIG. 1 is structured to execute phase controls of the light transmitting through the optical filter 12 not by the SOA 13 but by the phase variable section 20, so that the SOA 13 can be simplified. As a result, the manufacturing method of the SOA 13 can be simplified, so that it is possible to decrease the cost of the SOA 13 and to increase the yield thereof.

The optical filter 12 is a multiple optical resonator that is formed by coupling three ring resonators 24, 25, and 26 having different optical path lengths from each other. The ring resonators 24, 25, and 26 are structured with optical waveguides formed on the PLC 11. The wavelength variable sections 17, 18, and 19 are film-like heaters which change the temperatures of the optical waveguides constituting the ring resonators 24, 25, and 26, respectively. The phase variable section 20 is a film-like heater which changes the temperature of the optical waveguide 16 that connects the optical filter 12 and the light reflecting section 14.

The optical waveguide 16 is formed on the PLC 11 simultaneously with the ring resonators 24, 25, 26 and optical waveguides 15, 27, 28. The phase variable section 20 is also formed on the PLC 11 simultaneously with the wavelength variable sections 17, 18, and 19. With the wavelength variable laser device 10, phase controls of the light transmitting through the optical filter 12 is done not by the SOA 13 but by the phase variable section 20 that is provided additionally. However, as described above, the phase variable section 20 is formed simultaneously with other structural elements of the PLC 11, so that there is no increase in the number of manufacturing steps even when the phase variable section 20 is provided additionally.

The light reflecting section 14 is a loop mirror constituted with the optical waveguide formed on the PLC 11. Thus, the light reflecting section 14 is also formed on the PLC 11 simultaneously with the ring resonators 24 and the like. The ring resonators 24, 25, 26 and the optical waveguides 15, 27, 28 are optically coupled by directional couplers (not shown).

FIG. 2 is a schematic sectional view showing the SOA in the wavelength variable laser device shown in FIG. 1. Hereinafter, explanations will be described by referring to FIG. 1 and FIG. 2.

For example, the SOA 13 is preferable to be a Fabry-Perot type which has a single active layer 21 that is formed entirely with a same composition. The Fabry-Perot type is an SOA of the simplest structure. Further, the SOA 13 has a phase-modulation electrode 23 which modulates the phase of output light 22.

More specifically, the SOA 13 includes: a laminate body 33 formed with a p-type semiconductor layer 31, the active layer 21, and an n-type semiconductor layer 32; electrodes 34, 23, and 35 provided on the voltage applying surface of the laminate body 33; and a low-reflective coating 36 and a non-reflective coating 37 provided on the light emission surface of the laminate body 33. Further, the electrode 34 of the SOA 13 is the gain-control electrode 34, and the electrode 23 is the phase-modulation electrode 23.

Next, the wavelength variable laser device 10 will be described in more details by referring to FIG. 1 and FIG. 2.

The wavelength variable laser device 10 is constituted with: the SOA 13 having the non-reflective coating 37 applied on one of the two opposing light emission surfaces and having the low-reflective coating 36 applied on the other surface; the optical filter 12 that has a function of intensifying and outputting the light of a specific wavelength by being optically coupled with the surface of the non-reflective coating 37 of the SOA 13 and switching the center wavelength of the output light; and the light reflecting section 14 which reflects the light from the optical filter 12 to return it to the SOA 13 via the optical filter 12. The wavelength variable laser device 10 includes the phase variable section 20 which changes the optical path length between the optical filter 12 and the light reflecting section 14.

In the SOA 13, the active layer 21 that emits light by implantation of electric currents and has an optical gain is provided between the n-type semiconductor layer 32 and the p-type semiconductor layer 31, and it is a multiple-electrode SOA in which the electrodes 34 and 23 are divided into two along the light propagation direction. The electrode 34 is used for gain control, which implants the electric current for laser oscillation to a part of the active layer 21. The electrode 23 is used for phase control for controlling the phase condition by changing the refractive index through implanting the electric current for modulating the phase to a different part of the active layer 21. The n-type semiconductor layer 32 and the p-type semiconductor layer 31 are formed with InP, for example, and the active layer 21 is formed with InGaAsP, for example.

The optical filter 12 is a multiple optical resonator that is in a structure in which the ring resonators 24, 25, 26 of different optical path lengths are coupled via the optical waveguides 27, 28 between the optical waveguide 15 on the input/output side and the optical waveguide 16 on the reflection side. The wavelength variable sections 17, 18, and 19 for changing the resonance wavelength of the optical filter 12 are provided to the ring resonators 24, 25, and 26.

The wavelength variable laser device 10 is in a structure formed by mounting the SOA 13 on the PLC 11. The PLC 11 includes: the input/output side optical waveguide 15 having a connection port 15$i$ that is optically connected to the surface of the non-reflective coating 37 of the SOA 13 provided to one end; the reflection-side optical waveguide 16 having the light reflecting section 14 to one end; the optical filter 12 constituted with the ring resonators 24, 25, 26 and the optical waveguides 27, 28; the wavelength variable sections 17, 18, 19 for changing the refractive indexes of the ring resonators 24, 25, 26; and the phase variable section 20 which controls the phase condition of laser resonance by changing the optical path length of the reflection-side optical waveguide 16. Further, the PLC 11 is in a structure formed by depositing an oxidation film on an Si substrate and forming an embedded-type optical waveguide by increasing the refractive index of the core part. The ring resonators 24 and the like are formed by the embedded-type optical waveguides.

With the wavelength variable laser device 10, the light generated at the SOA 13 passes through the optical filter 12 and is reflected at the light reflecting section 14. Thereby, resonance light is outputted to the outside from the surface of the low-reflective coating 36 of the SOA 13. At this time, the optical filter 12 within the PLC 11 transmits only the light of a specific wavelength, thereby making it possible to achieve a single-axis mode oscillation. This oscillation wavelength changes by controlling the electric current to the wavelength variable sections 17, 18, 19 and the phase variable section 20.

The ring resonators 24, 25, 26 and the optical waveguides 15, 16, 27, 28 within the PLC 11 are formed by quartz glass waveguides that are formed by depositing quartz glass on a silicon substrate or a glass substrate, for example. The optical filter 12 is in a structure in which the ring resonators 24, 25, and 26 are connected in series. The ring resonators 24, 25, and 26 have different optical path lengths (a product of the refractive index and the geometrical length of a medium through which light propagates) from each other. The optical filter 12 synthesizes and divides the optical waves of the light of a resonance wavelength only when the ring resonators 24, 25, and 26 resonate simultaneously, and acquires a large FSR (Free Spectral Range) by the Vernier effect.

The Vernier effect is such a phenomenon that resonance frequencies of each resonator with shifted peak periods overlap with each other at the least common multiple thereof when a plurality of resonators of different optical path lengths are combined. A multiple optical resonator obtained by combining a plurality of resonators so functions that the FSR appears to become a frequency of the least common multiple of the resonance frequencies of each of the resonators by the use of the Vernier effect. Thereby, it becomes possible to control the property of the frequency within a range wider than that of a single resonator.

The wavelength variable laser device 10 is structured to select the resonance mode and perform a single-mode oscillation by utilizing the wavelength transmittance property of each drop port of the ring resonators 24, 25, and 26. Through designing each of the optical path lengths of the ring resonators 24, 25, and 26 to be slightly different, the resonance wavelength of the optical filter 12 coincides only at one point even in a wide wavelength range of several tens of nm. Therefore, a single-mode oscillation is generated at the coincident wavelength.

For example, FSR of the ring resonator 24 is fixed to ITU (International Telecommunication Union)-grid. Thereby, the resonance wavelength in the optical filter 12, which is the least common multiple wavelength of the resonance wavelengths of each of the rings resonators 24, 25, and 26, can be set to the wavelength on the ITU-grid. In this case, it is preferable to use the ring resonator 24 for fixing the ITU-grid, the ring resonator 25 for fine adjustment, and the ring resonator 26 for coarse adjustment.

The wavelength variable sections 17, 18, and 19 are formed by corresponding to the positions of the ring-like optical waveguides of the ring resonators 24, 25, and 26. The ring-like optical waveguides of the ring resonators 24, 25, and 26 are formed with glass or a compound semiconductor, and the refractive indexes thereof change due to changes in the temperature. Thus, the wavelength variable sections 17, 18, and 19 apply heat to the ring-like optical waveguides of the ring resonators 24, 25, and 26 to individually change the refractive indexes thereof. Therefore, it is possible to change the resonance wavelength in the optical filter 12 by simultaneously controlling the optical path lengths of the ring resonators 24, 25, and 26.

Further, the wavelength variable laser device 10 includes the phase variable section 20. The phase variable section 20 changes the refractive index of the reflection-side optical waveguide 16 to adjust the phase condition of laser resonance.

Note here that the wavelength variable sections 17, 18, 19 and the phase variable section 20 are film-like heaters made with an aluminum film that is vapor-deposited on the respective positions corresponding to the ring resonators 24, 25, 26 and the optical waveguide 16, for example. Further, the wavelength variable sections 17, 18, 19 and the phase variable section 20 change the refractive indexes of each of the optical waveguides through changing the temperatures locally by being turned on to execute wavelength variable processing and phase adjustment.

The SOA 13 is mounted without being adjusted on the PLC 11 by passive alignment, and optically connected to the connection port 15$i$. The light generated in the SOA 13 is reflected at the light reflecting section 14 via the optical filter 12, returned to the SOA 13 again via the optical filter 12, and reflected at the surface of the low-reflective coating 36. Thereby, a laser resonator is formed between the surface of the low-reflective coating 36 of the SOA 13 and the light reflecting section 14, and laser oscillation is generated. Oscillation light (output light 22) is outputted from the surface of the low-reflective coating 36 of the SOA 13.

The SOA 13 is in a structure in which the active layer 21 having the optical gain and the p-type semiconductor layer 31 as a clad layer are laminated on the n-type semiconductor layer 32. The SOA 13 is structured to include the electrode 35 on the bottom face of the n-type semiconductor layer 32 and to include the two electrodes 34, 23 along the light propagation direction on the top face of the p-type semiconductor layer 31 to implant the electric current to the electrodes 34, 23 individually. Further, in the SOA 13, the non-reflective coating 37 is applied on the end face that is optically connected to the optical waveguide 15 on the input/output side of the optical filter 12, and the low-reflective coating 36 of about 5% is applied to the opposite-side end face thereof of the external output side. The electrode 34 implants the electric current for gain control to the active layer 21. The electrode 23 implants the electric current for phase modulation to the active layer 21.

In the SOA 13, the refractive index of the part corresponding to the electrode 23 of the active layer 21 changes by changing the electric current implanted to the electrode 23, and the light phase is modulated thereby. The change in the refractive index of the active layer 21 caused by implanting the electric current to the electrode 23 can be fluctuated at a higher speed than the refractive index fluctuation caused by changes in the temperature, since it is done by electric controls. Thus, it is possible with the SOA 13 to achieve modulation response of several tens of kHz to several hundreds of kHz. The phase modulation achieved thereby can expand the effective spectral line width, so that it is used for suppressing SBS generated in the optical fiber that is the output destination.

In the meantime, in the phase control region 83 shown in FIG. 6, electric currents are implanted to the active layer 86 of the composition wavelength having no optical gain. Thus, while there is a large refractive index change generated by the plasma effect of the carriers, there is a loss increase due to free carrier absorption. Further, the carriers in the phase control region 83 are not clamped in a laser oscillation state. Thus, a refractive index fluctuation therein occurs, so that shot noises are increased thereby.

In the meantime, the maximum value of the refractive index change by the carrier implantation to the active layer 21 of the SOA 13 is a fluctuation of the layer of the composition wavelength that has the optical gain for the resonance wavelength. Thus, it is smaller than the maximum value of the refractive index change by the carrier implantation to the active layer 86 of the composition wavelength having no optical gain in the phase control region 83 of FIG. 6. This is because a part of the carriers is clamped after laser oscillation, since the composition wavelength of the active layer 21 under the electrode 34 for the gain control and that of the optical waveguide layer (active layer 21) under the electrode 23 for the phase modulation are the same. Thus, the refractive index change becomes smaller than that of the phase control region 83 shown in FIG. 6 where no clamp is done. However, the active layer 21 has the optical gain, so that a loss increase in propagation light caused due to an in crease in the carrier density at the time of phase modulation is suppressed. The electrodes 34 and 23 may also be used collectively as a single electrode. However, in that case, the refractive index change becomes still smaller because the carrier density is clamped after the oscillation.

In the wavelength variable laser device 10, the phase variable section 20 performs controls of the phase condition of laser resonance to perform high-speed phase modulation for suppressing SBS by adding the phase-modulation electric current to the electrode 23 of the SOA 13. That is, high-speed phase modulation is performed to have the oscillation wavelength fluctuate so as to suppress SBS generated in the optical fiber that is the output destination.

As described above, a mechanism for performing a high-speed phase modulation and a mechanism for performing a relatively large phase control are separated to form the phase control mechanism within the SOA 13 into a structure that executes only small phase modulation at a high speed, i.e., the SOA 13 is formed as a multiple-electrode SOA having a single active layer 21.

The SOA 13 makes it possible to suppress the loss increase that is generated at the time of phase control in the SOA 73 with the phase control region 83 shown in FIG. 6, so that it is possible to achieve a fine oscillation property with which no light output decrease occurs. Further, it is possible to suppress an increase in the shot noise caused due to electric current implantation at the time of phase control, thereby making it possible to perform a narrow spectral line width action.

Furthermore, in the SOA 73 with the phase control region 83 shown in FIG. 6, it is necessary to separately form heterogeneous active layers 85, 86 with a gain control region 93 having the optical gain and the phase control region 83 having no optical gain. This makes it difficult to manufacture, and the manufacturing cost is raised. In the meantime, the SOA 13 of the exemplary embodiment can be formed as the simplest structure like a normal Fabry-Perot laser, and it only requires a single active layer 21. Therefore, it is effective for suppressing wavelength fluctuation and for decreasing the output loss. This also makes it possible to decrease the manufacturing cost.

In the wavelength variable laser device 10, ASE light generated in the SOA 13 is outputted by being propagated on a path of the SOA 13→the optical filter 12→the light reflecting section 14→the optical filter 12→the SOA 13. The ring resonators 24, 25, and 26 have different FSR from each other. Thus, at the wavelength with which periodical changes of reflections and transmissions generated in each of the ring resonators 24, 25, and 26 coincide with each other, still larger reflection and transmission occur. Thereby, light from the SOA 13 returned by being reflected at the light reflecting section 14 becomes the strongest at the resonance wavelength of the optical filter 12.

Through controlling the power supplied to the wavelength variable section 17, 18, and 19 formed in the ring resonators 24, 25, and 26 in the wavelength variable laser device 10, oscillation laser light of a specific wavelength can be outputted externally. Then, the power supplied to the phase variable section 20 is changed while the power supplied to the wavelength variable sections 17, 18, and 19 is being fixed so as to adjust the phase condition of the entire laser resonance.

As described above, with the wavelength variable laser device 10, phase adjustment for optimizing the phase of laser resonance is performed by the phase variable section 20 that is formed in the optical waveguide 16 within the PLC 11. Further, relatively high-speed phase modulation for SBS suppression is performed by changing a part of the refractive index of the active layer 21 having the optical gain through implanting the electric current to the phase-modulation electrode 23 of the SOA 13. Thus, an increase in the light loss caused due to an increase in the carrier density inside the SOA 13 can be suppressed, thereby making it possible to achieve a fine oscillation property.

FIG. 3 is a plan view showing a second exemplary embodiment of the wavelength variable laser device according to the present invention. Hereinafter, explanations will be provided by referring to the drawing. However, explanations of the same components as those of FIG. 1 will be omitted by applying the same reference numerals thereto.

A wavelength variable laser device 40 according to the exemplary embodiment is formed by further adding, to the wavelength variable laser device 10 (FIG. 1) of the first exemplary embodiment, a light-receiving element 41 which detects light from the ring resonator 24 via a through-port 15t, and a control section 42 which adjusts the amount of power supplied to the wavelength variable sections 17, 18, 19 and the phase variable section 20 so that the light amount detected at the light-receiving element 41 becomes small.

The light-receiving element 41 is a photodiode, for example. The control section 42 is formed with a microcomputer, an AD converter, a DA converter, a power-supply transistor, and the like, for example, and also has a function of adjusting the amount of power supplied to the SOA 13. That is, the control section 42 inputs a signal showing a prescribed wavelength from another computer or the like, and adjusts the amount of power supplied to the wavelength variable sections 17, 18, 19, the phase variable section 20, and the SOA 13 so that the output light 22 of that wavelength can be obtained.

The amount of light detected at the light-receiving element 41 via a through-port 15*t* becomes the least with the resonance wavelength of the optical filter 12. Therefore, it is possible to obtain the resonance wavelength of the optical filter 12 through adjusting the amount of power supplied to the wavelength variable section 17 and the like in such a manner that the light amount detected at the light-receiving element 41 becomes small. The light-receiving element 41 may also be provided to a through-port of another ring resonator. In that case, the control section 42 may adjust the amount of power supplied to the wavelength variable section 17 and the like in such a manner that the sum of the light amounts detected at two or more light-receiving elements becomes small.

FIG. 4 is a block diagram showing an example of the functions of the control section shown in FIG. 3. FIG. 5 is a flowchart showing an example of actions of the control section shown in FIG. 3. Hereinafter, explanations will be provided by referring to FIG. 3-FIG. 5.

An example of the functions of the control section 42 will be described by referring to FIG. 4. The control section 42 includes: a light-amount input module 43 which inputs a light amount detected at the light-receiving element 41; a first power changing module 44 which changes the power to be supplied to the wavelength variable sections 17, 18, and 19 in such a manner that the inputted light amount becomes small; a first power supplying module 45 which supplies the changed power to the wavelength variable sections 17, 18, and 19; a second power changing module 46 which changes the power to be supplied to the phase variable section 20 in such a manner that the inputted light amount becomes small; and a second power supplying module 47 which supplies the changed power to the phase variable section 20. Those modules are achieved by causing a microcomputer to execute a program, for example.

Further, the light-amount input module 43 inputs a photo-current of the light-receiving element 41 as data of the light amount via the AD converter. The first power changing module 44 and the second power changing module 46 change the power by a method determined in advance such as a dither action. The first power supplying module 45 and the second power supplying module 47 supply the power to the wavelength variable sections 17, 18, 19 and the phase variable section 20 via the DA converter and the power-supplying transistor.

An example of the action of the control section 42 will be described by referring to FIG. 5. First, the light amount is inputted from the light-receiving element 41 (step 101). Subsequently, it is judged whether or not the light amount is the minimum (step 102). a plurality of sets of data of combinations of the light amount and supplied power to the wavelength variable sections 17,—are required. When the light amount is not the minimum, the power supplied to the wavelength variable sections 17, 18, and 19 is changed (step 103), and the changed power is supplied to the wavelength variable sections 17, 18, and 19 (step 103). At this time, when the ring resonator 24 is used for fixing ITU-grid, the ring resonator 25 is used for fine adjustment, and the ring resonator 26 is used for coarse adjustment, the supplied power is determined first for the wavelength variable section 19, then for the wavelength variable section 18, and at last for the wavelength variable section 17 as necessary.

When it is judged in step 102 that the light amount is the minimum, the light amount is inputted from the light-receiving element 41 (step 105). Subsequently, it is judged whether or not the light amount is the minimum (step 106). A plurality of sets of data of combinations of the light amount and supplied power to the phase variable section 20,—are required. When the light amount is not the minimum, the supplied power to the phase variable section 20 is changed (step 107), and the changed power is supplied to the phase variable section 20 (step 108). When it is judged in step 106 that the light amount is the minimum, all the supplied powers are determined.

As described, adjustment of the SOA 12 is unnecessary when acquiring the resonance wavelength of the optical filter 12, so that the SOA 12 can be simplified.

Needless to say, the present invention is not limited only to each of the above-described exemplary embodiments. For example, the optical filter 12 may be formed by connecting two ring resonators or four or more sing resonators. Further, each of the ring resonators may be directly connected only with a directional coupler. Furthermore, the present invention is not only applicable to the ring resonator but also to a resonator that can be formed by an optical waveguide. For example, a structure in which Mach-Zehnder interferometers are connected in multiple stages may be employed, for example.

Furthermore, the light reflecting section 14 may also be a high-reflective coating. The phase variable section 20 may also be a film-like heater which changes the temperature of the optical waveguide 15 connecting the SOA 13 and the optical filter 12 or the temperatures of the optical waveguides 27, 28 connecting the ring resonators 24, 25, and 26. The structure constituted with the ring resonators 24, 25, 26 and the wavelength variable sections 17, 18, 19 which change the refractive indexes of the optical waveguides thereof may simply need to be an optical filter that achieves a single-axis mode by intensifying a specific wavelength, such as a structure constituted with an optical waveguide in which grating is formed and a module that controls the refractive index of the optical waveguide. The wavelength variable sections 17, 18, 19 and the phase variable section 20 may be structured to perform wavelength variable processing and the phase control processing by changing the refractive index of the optical waveguide through applying distortion or implanting an electric current, etc., used in a compound semiconductor integrated optical device.

While the present invention has been described by referring to the embodiments (and examples), the present invention is not limited only to those embodiments (and examples) described above. Various kinds of modifications that occur to those skilled in the art can be applied to the structures and details of the present invention within the scope of the present invention.

This Application is the National Phase of PCT/JP2009/054319, filed Mar. 6, 2009, which claims the Priority right based on Japanese Patent Application No. 2008-081035 filed on Mar. 26, 2008 and the disclosure thereof is hereby incorporated by reference in its entirety.

INDUSTRIAL APPLICABILITY

The present invention can contribute to simplifying the SOA and simplifying the manufacturing method of the SOA through performing the phase control of the light that transmits through the optical filter not by the SOA but by the phase variable section.

Figure 1:
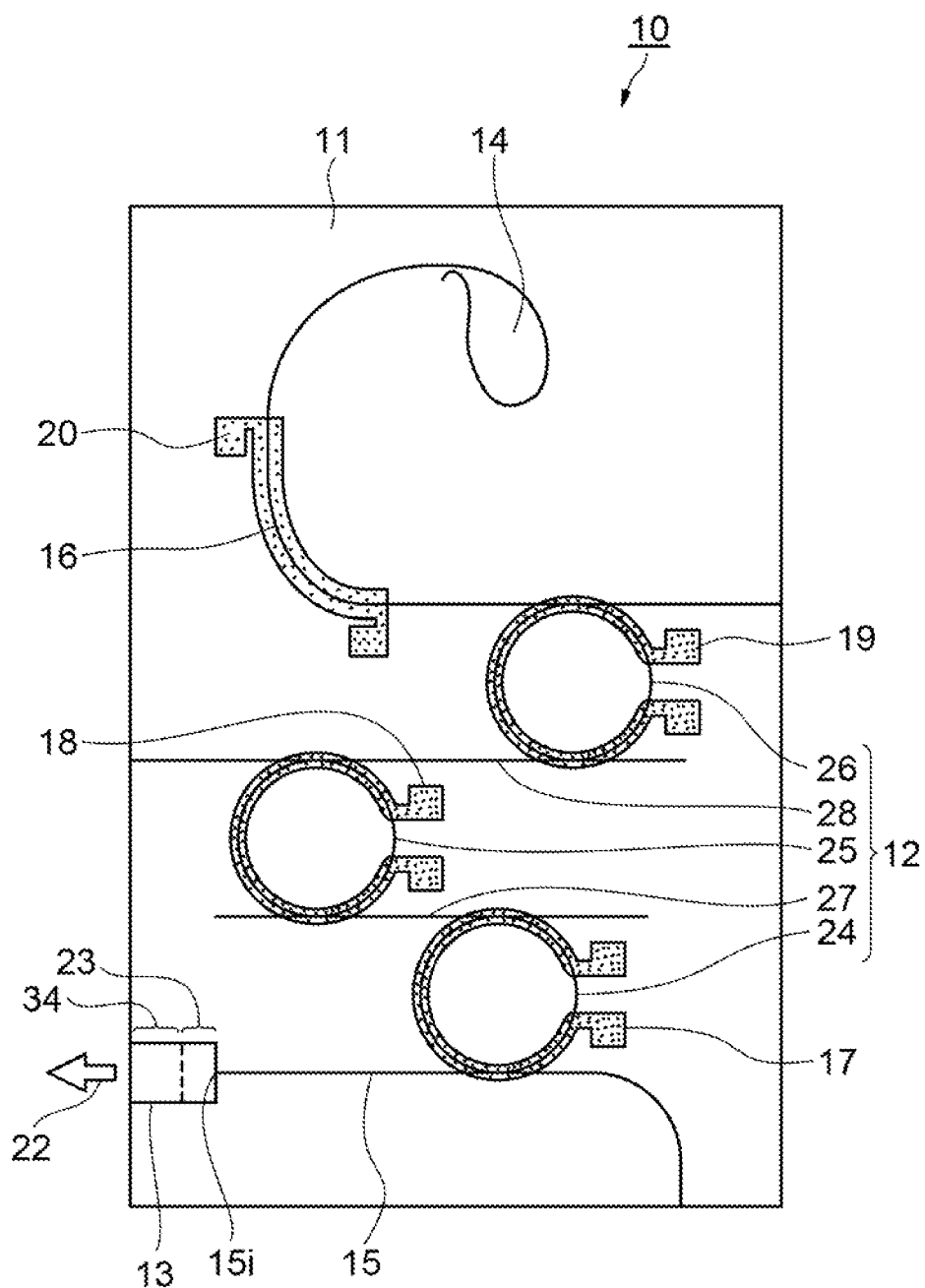
FIG. 1 is a plan view showing a first exemplary embodiment of a wavelength variable laser device according to the present invention.
Figure 2:
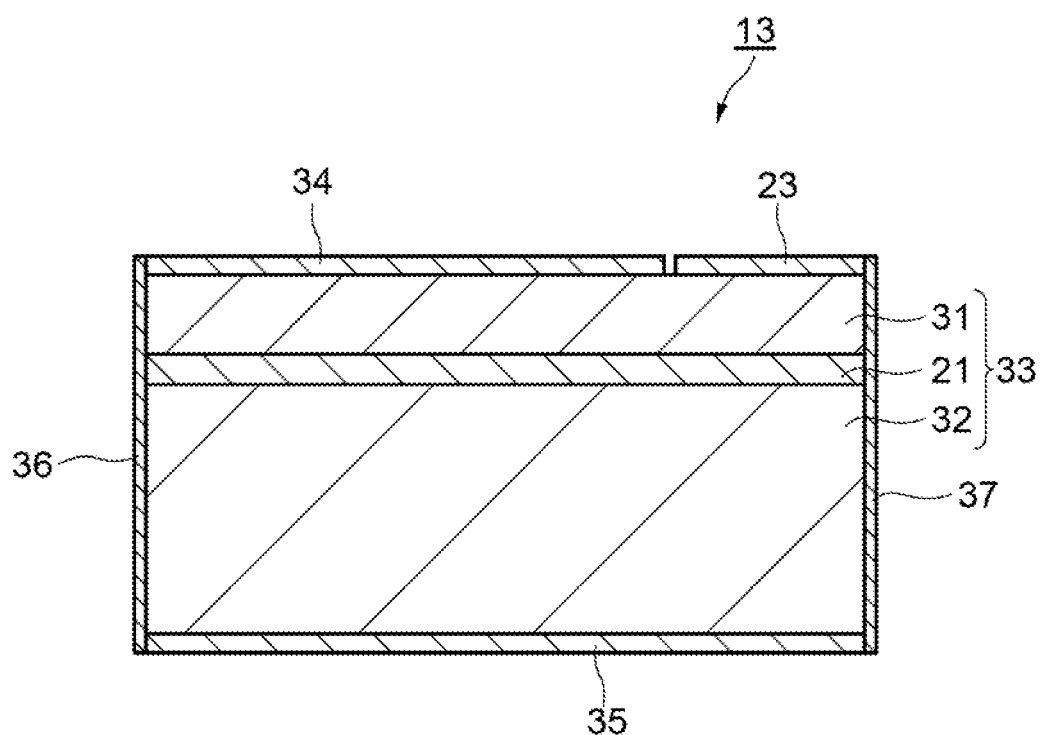
FIG. 2 is a schematic sectional view showing an SOA of the wavelength variable laser device shown in FIG. 1.
Figure 3:
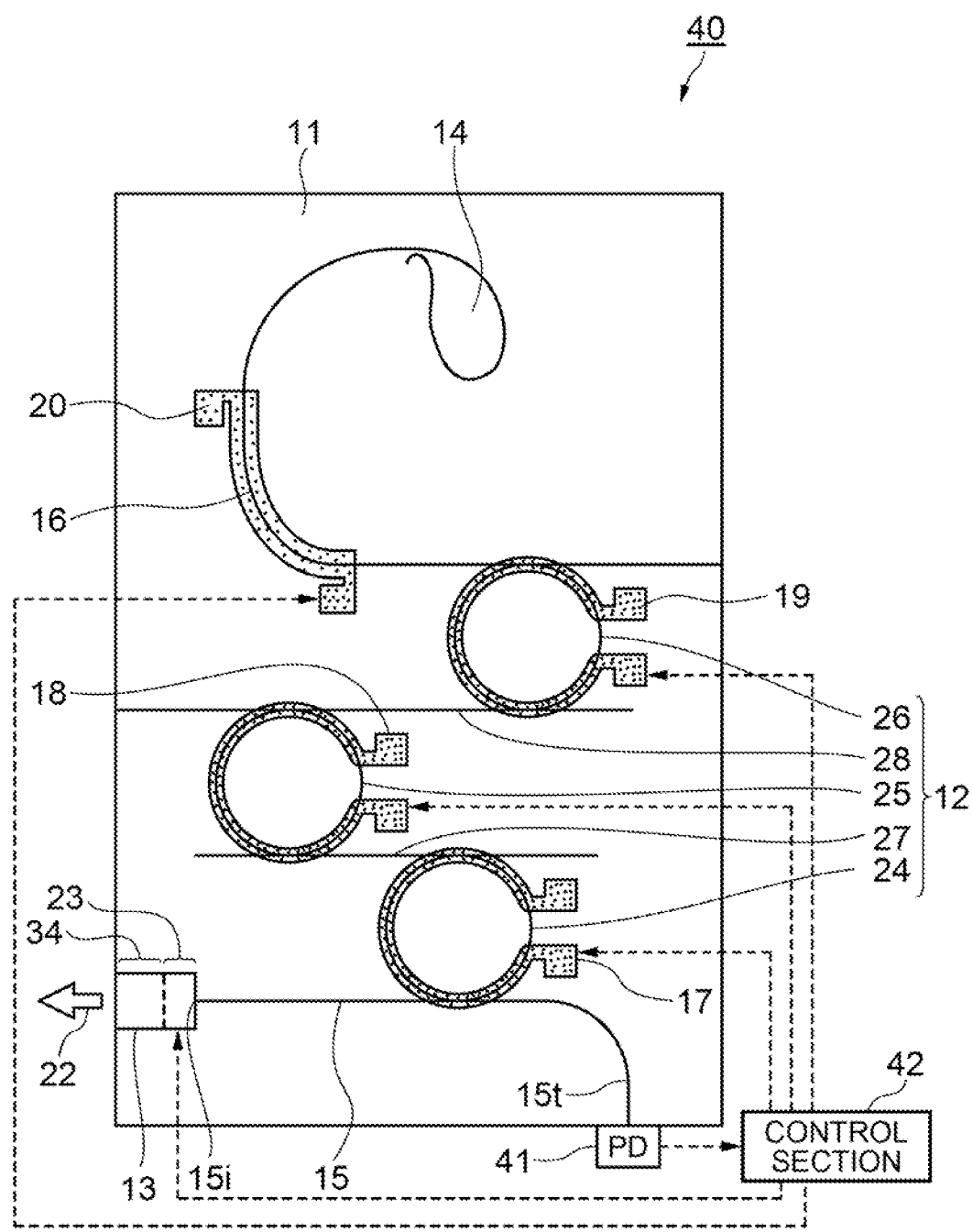
FIG. 3 is a plan view showing a second exemplary embodiment of the wavelength variable laser device according to the present invention.
Figure 4:
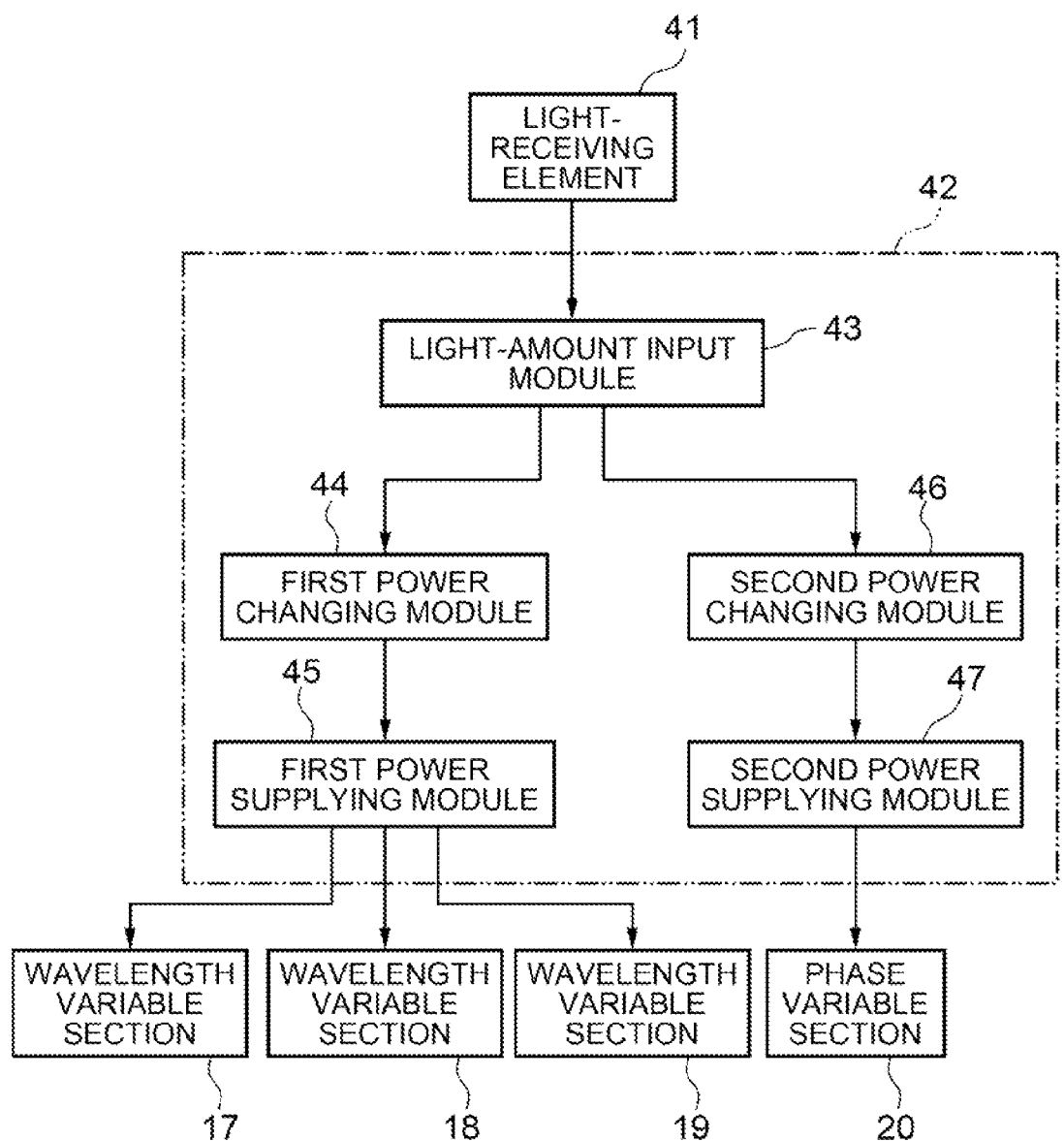
FIG. 4 is a block diagram showing an example of functions of a control section shown in FIG. 3.
Figure 5:
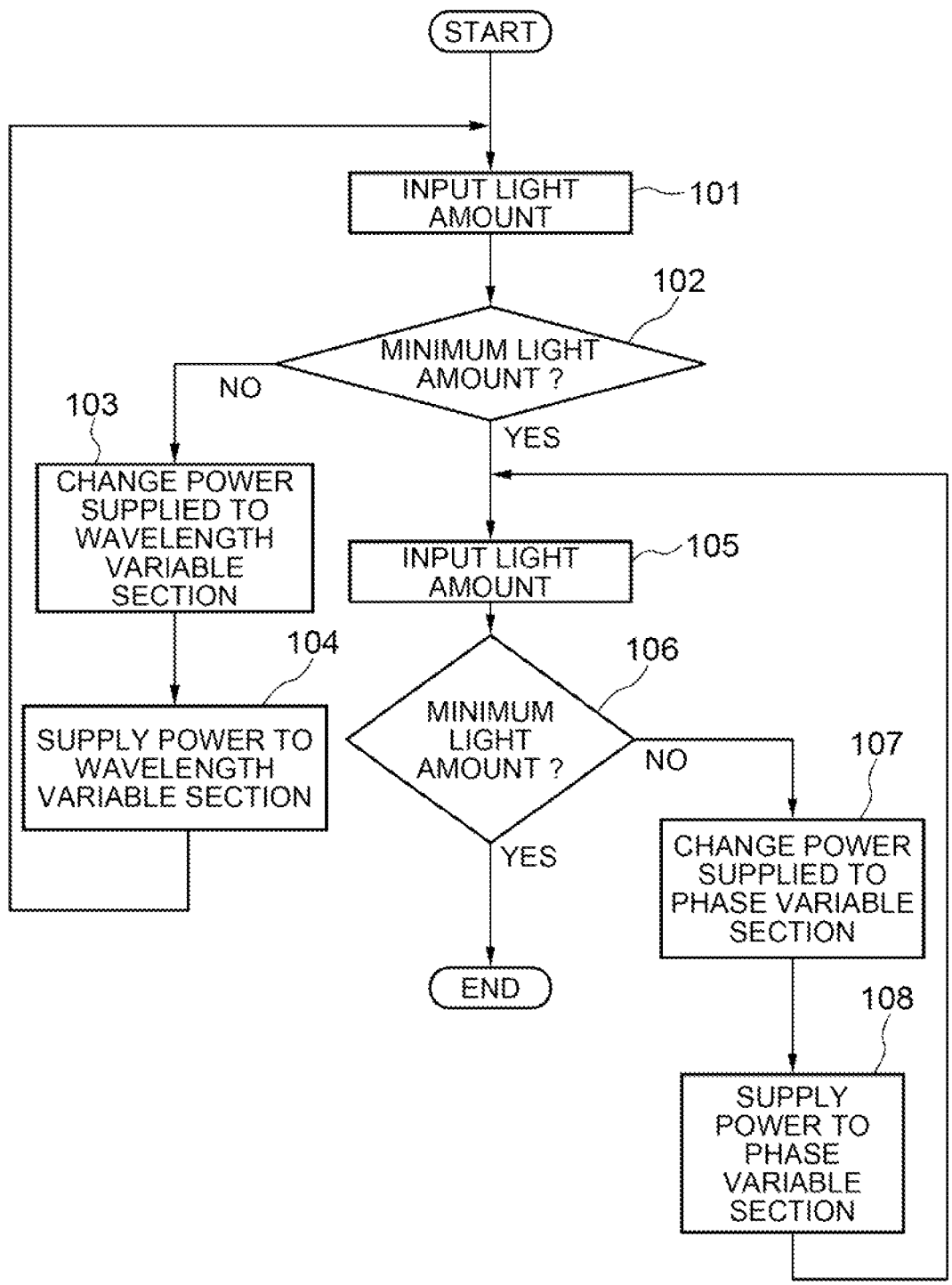
FIG. 5 is a flowchart showing an example of actions of the control section shown in FIG. 3.
Figure 6:
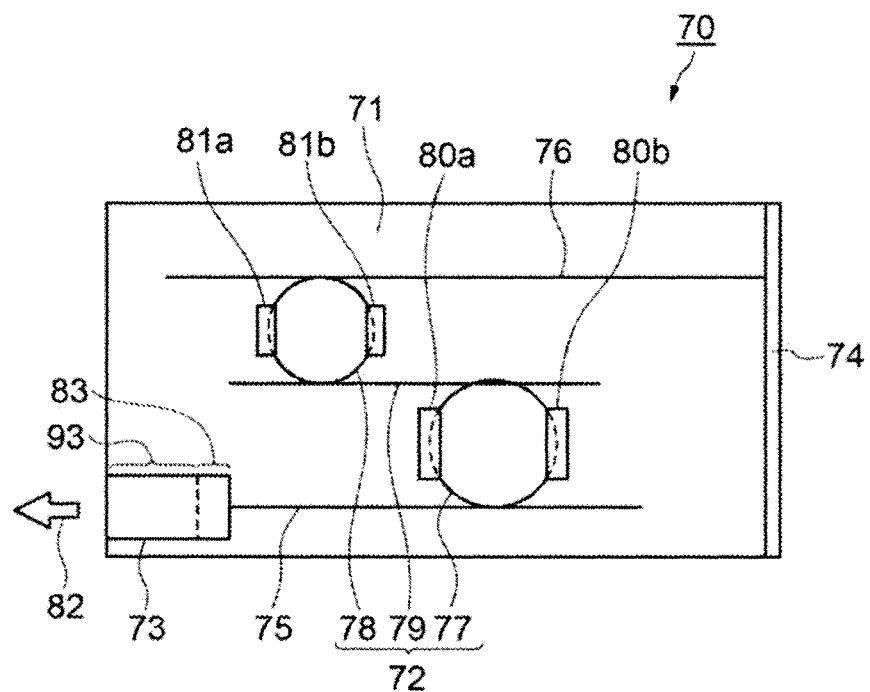
FIG. 6 is a plan view showing a wavelength variable laser related to the present invention.
Figure 7:
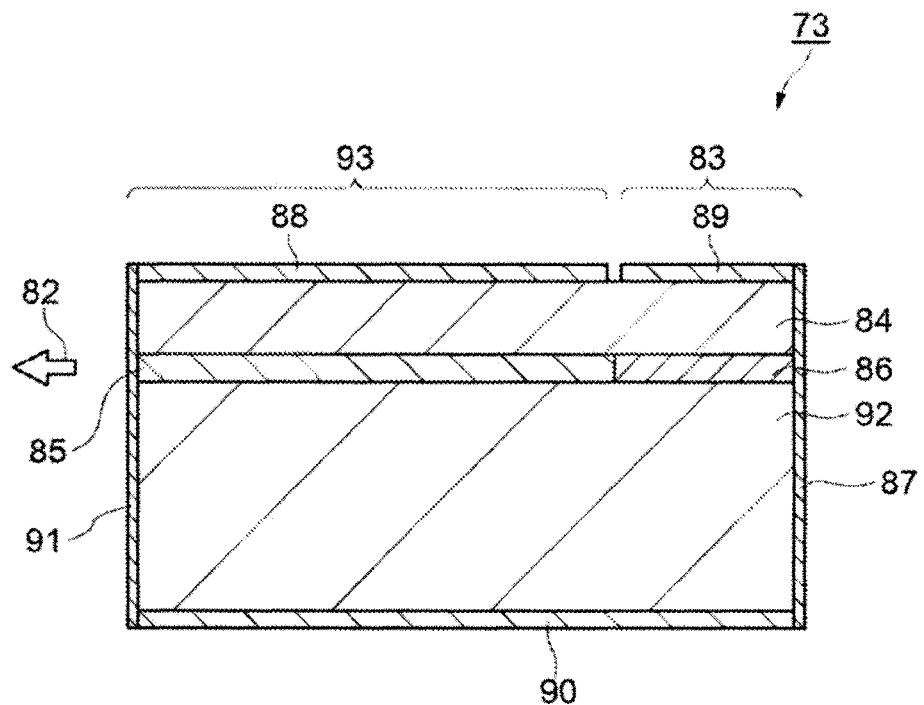
FIG. 7 is a schematic sectional view showing an SOA of the wavelength variable laser device shown in FIG. 6.

REFERENCE NUMERALS 10, 40 Wavelength variable laser device
11 PLC
12 Optical filter
13 SOA
14 Light reflecting section
15, 16, 27, 28 Optical waveguide
17, 18, 19 Wavelength variable section
20 Phase variable section
21 Active layer
22 Output light
23, 34, 35 Electrode
24, 25, 26 Ring resonator
27, 28 Optical waveguide
31 P-type semiconductor layer
32 N-type semiconductor layer
33 Laminate body
36 Low-reflective coating
37 Non-reflective coating
41 Light-receiving element
42 Control section
43 Light-amount input module
44 First power changing module
45 First power supplying module
46 Second power changing module
47 Second power supplying module

The invention claimed is:

1. A wavelength variable laser device, comprising:
an optical filter formed by three ring resonators having different optical path lengths from each other, wherein the ring resonators are formed by optical waveguides that are formed in a planar lightwave circuit;
a semiconductor optical amplifier being of a Fabry-Perot type that supplies light supplies light to the optical filter, the semiconductor optical amplifier including:
a single active layer that is formed entirely with a same composition, and
a phase-modulation electrode that performs high-speed phase modulation for suppressing stimulated Brillouin scattering of output light by changing a refractive index of the active layer through implanting electric current to the active layer;
a light reflecting section that returns the light transmitted through the optical filter to the semiconductor optical amplifier via the optical filter;
optical waveguides which are formed in the planar lightwave circuit and connect the semiconductor optical amplifier, the optical filter, and the light reflecting section;
a wavelength variable section comprising three film-like heaters that change a wavelength of the light transmitting through the optical filter by separately changing temperatures of the optical waveguides that constitute the three ring resonators;
a phase variable section comprising a film-like heater that performs a phase adjustment for optimizing a phase of a laser resonance of the light propagated on the optical waveguides by changing temperatures of one of the optical waveguides connecting the semiconductor optical amplifier, the optical filter, and the reflective section or temperature of one of the optical waveguides connecting the plurality of ring resonators;
a light-receiving element that detects light from at least one of the plurality of ring resonators via a through-port; and
a control section that adjusts an amount of power supplied to the wavelength variable section and the phase variable section in such a manner that a light amount detected at the light-receiving element becomes small, wherein
the three ring resonators comprises a ring resonator for fixing an ITU-grid, a ring resonator for fine adjustment, and a ring resonator for coarse adjustment.

2. The wavelength variable laser device as claimed in claim 1, wherein
the light reflecting section is a loop mirror structured with an optical waveguide that is formed in the planar lightwave circuit.

3. A wavelength variable laser device, comprising:
an optical filter formed by coupling three ring resonators having different optical path lengths from each other, wherein the ring resonators are formed by optical waveguides that are formed in a planar lightwave circuit;
semiconductor optical amplifying means for supplying light to the optical filter, the semiconductor optical amplifying means being of a Fabry-Perot type, and including:
a single active layer that is formed entirely with a same composition, and
a phase-modulation electrode means that performs high-speed phase modulation for suppressing stimulated Brillouin scattering of output light by changing a reflective index of the active layer though implanting electric current to the active layer;
light reflecting means for returning the light transmitted through the optical filter to the semiconductor optical amplifier via the optical filter;
optical waveguides which are formed in the planar lightwave circuit and connect the semiconductor optical amplifying means, the optical filter, and the light reflecting means;
wavelength variable means comprising three film-like heaters that change a wavelength of the light transmitting through the optical filter by separately changing temperatures of the optical waveguides that constitute the three ring resonators; and a phase variable means comprising a film-like heater that performs phase adjustment for optimizing a phase of a laser resonance of the light propagated on the optical waveguides by changing temperatures of one of the optical waveguides connecting the semiconductor optical amplifier, the optical filter, and the reflective section or temperature of one of the optical waveguides connecting the plurality of ring resonators;

light-receiving means for detecting light from at least one of the plurality of ring resonators via a through-port; and control means for adjusting an amount of power supplied to the wavelength variable means and the phase variable means in such a manner that a light amount detected at the light-receiving means becomes small, wherein the three ring resonators comprises a ring resonator for fixing an ITU-grid, a ring resonator for fine adjustment, and a ring resonator for coarse adjustment.

\* \* \* \* \*